(12) United States Patent
Chen et al.

(10) Patent No.: US 8,407,846 B2
(45) Date of Patent: Apr. 2, 2013

(54) SCRUBBER BRUSH WITH SLEEVE AND BRUSH MANDREL FOR USE WITH THE SCRUBBER BRUSH

(75) Inventors: Hui Chen, Burlingame, CA (US); Sheshraj L. Tulshibagwale, Santa Clara, CA (US); Hideshi Takahashi, Ryugasaki (JP); Toshikazu Tomita, Chiba-ken (JP); Takashi Fujikawa, Chiba (JP)

(73) Assignee: Applied Materials, Inc., Santa Clara, CA (US)

( * ) Notice: Subject to any disclaimer, the term of this patent is extended or adjusted under 35 U.S.C. 154(b) by 1370 days.

(21) Appl. No.: 11/683,116

(22) Filed: Mar. 7, 2007

(65) Prior Publication Data
US 2007/0209135 A1 Sep. 13, 2007

Related U.S. Application Data

(60) Provisional application No. 60/780,688, filed on Mar. 7, 2006.

(51) Int. Cl.
*B05C 1/00* (2006.01)
(52) U.S. Cl. ............ 15/179; 15/230.16; 15/230; 300/21
(58) Field of Classification Search .................... 15/230, 15/230.16–230.19, 230.11, 179, 24; 492/45; 300/21
See application file for complete search history.

(56) References Cited

U.S. PATENT DOCUMENTS

| 490,831 A | 1/1893 | Lohers |
|---|---|---|
| 511,606 A | 12/1893 | Frink |
| 780,768 A | 1/1905 | Wiggins |
| 826,288 A * | 7/1906 | Tilgner ........................ 74/447 |
| 1,613,396 A | 1/1927 | Keller, Sr. |
| 1,744,365 A | 1/1930 | Burgess |
| 1,748,414 A | 2/1930 | Gibson et al. |
| 2,029,459 A | 2/1936 | Fred |
| 2,509,957 A | 5/1950 | Briggs |
| 2,563,049 A | 8/1951 | Liebelt et al. |
| 2,565,743 A | 8/1951 | Schaefer |
| 2,667,867 A | 2/1954 | Petersen |
| 2,739,429 A | 3/1956 | Peterson |
| 2,894,744 A | 7/1959 | Schulze |
| 3,060,555 A | 10/1962 | Kirshenbaum |
| 3,129,960 A | 4/1964 | Schrodt |
| 3,182,345 A | 5/1965 | Smith |

(Continued)

FOREIGN PATENT DOCUMENTS

| DE | 9211938.7 U1 | 11/1992 |
|---|---|---|
| DE | 19925375 A1 | 2/2001 |

(Continued)

OTHER PUBLICATIONS

Notice of Abandonment of U.S. Appl. No. 11/048,099 Mailed Feb. 2, 2010.

(Continued)

*Primary Examiner* — Laura C Guidotti
(74) *Attorney, Agent, or Firm* — Dugan & Dugan, PC

(57) ABSTRACT

In one aspect, a scrubber brush assembly is provided. The scrubber brush assembly includes (1) a cylindrical brush including exterior and interior surfaces; and (2) a sleeve having an exterior surface coupled to the interior surface of the scrubber brush and an interior surface. The exterior surface of the sleeve includes first coupling features adapted to prevent rotation of the sleeve relative to the brush. The scrubber brush assembly also includes a mandrel coupled to the interior surface of the sleeve. Numerous other aspects are provided.

17 Claims, 8 Drawing Sheets

U.S. PATENT DOCUMENTS

| | | | |
|---|---|---|---|
| 3,380,097 A | | 4/1968 | Pharris |
| 3,466,691 A | | 9/1969 | Wessel |
| 3,500,490 A | * | 3/1970 | Teren .................. 15/97.1 |
| 3,519,277 A | | 7/1970 | Crocker |
| 3,574,880 A | | 4/1971 | Butzen |
| 3,584,328 A | | 6/1971 | Lechene et al. |
| 3,649,985 A | | 3/1972 | Hunt |
| 3,679,277 A | | 7/1972 | Dohmen |
| 3,774,982 A | | 11/1973 | Nakamura et al. |
| 3,812,551 A | | 5/1974 | Mortensen |
| 3,826,581 A | * | 7/1974 | Henderson .................. 401/287 |
| 3,827,492 A | | 8/1974 | Hammon et al. |
| 3,879,786 A | | 4/1975 | Larkin |
| 3,919,754 A | | 11/1975 | Sorresso |
| 3,943,593 A | | 3/1976 | Gould et al. |
| 3,971,097 A | | 7/1976 | Clark |
| 4,135,553 A | | 1/1979 | Evans et al. |
| 4,165,551 A | | 8/1979 | Rosseau |
| 4,326,619 A | | 4/1982 | Garnett |
| 4,348,067 A | | 9/1982 | Tooley |
| 4,361,923 A | | 12/1982 | McKay |
| 4,438,812 A | | 3/1984 | Hammon |
| 4,557,506 A | | 12/1985 | Hanks et al. |
| 4,561,763 A | | 12/1985 | Basch |
| 4,627,127 A | | 12/1986 | Dupre |
| 4,846,531 A | | 7/1989 | Boland et al. |
| 4,914,777 A | | 4/1990 | Cartellone |
| 4,972,939 A | | 11/1990 | Uttke et al. |
| 5,036,625 A | | 8/1991 | Gosis |
| 5,046,231 A | | 9/1991 | Thompson |
| 5,342,282 A | | 8/1994 | Letourneur |
| 5,375,291 A | | 12/1994 | Tateyama et al. |
| 5,461,464 A | | 10/1995 | Swain |
| 5,475,889 A | | 12/1995 | Thrasher et al. |
| 5,495,657 A | | 3/1996 | Zeisner et al. |
| 5,522,785 A | | 6/1996 | Kedl et al. |
| 5,527,209 A | | 6/1996 | Volodarsky et al. |
| 5,701,625 A | | 12/1997 | Siman |
| 5,707,186 A | | 1/1998 | Gobell et al. |
| 5,715,557 A | | 2/1998 | Hsu |
| 5,749,584 A | | 5/1998 | Skinner et al. |
| 5,829,087 A | | 11/1998 | Nishimura et al. |
| 5,901,643 A | | 5/1999 | Bornhorst |
| 5,924,154 A | | 7/1999 | Gockel et al. |
| 6,070,284 A | | 6/2000 | Garcia et al. |
| 6,082,377 A | | 7/2000 | Frey |
| 6,119,295 A | | 9/2000 | Gockel |
| 6,247,197 B1 | | 6/2001 | Vail |
| 6,308,369 B1 | | 10/2001 | Garcia et al. |
| 6,324,714 B1 | | 12/2001 | Walz et al. |
| 6,378,158 B1 | | 4/2002 | Bukovitz |
| 6,427,566 B1 | * | 8/2002 | Jones et al. .................. 82/101 |
| 6,728,989 B2 | | 5/2004 | Lerner et al. |
| 6,820,298 B2 | | 11/2004 | White et al. |
| 6,981,291 B2 | * | 1/2006 | McKay .................. 15/23 |
| 7,389,560 B2 | | 6/2008 | Mertins, Jr. |
| 7,657,959 B2 | | 2/2010 | Smith et al. |
| 2004/0031117 A1 | * | 2/2004 | Gaser et al. .................. 15/179 |
| 2005/0172438 A1 | | 8/2005 | Yudovsky et al. |
| 2009/0025197 A1 | | 1/2009 | Yudovsky et al. |
| 2009/0031516 A1 | | 2/2009 | Yudovsky et al. |

FOREIGN PATENT DOCUMENTS

| | | |
|---|---|---|
| EP | 0 837 493 A2 | 4/1998 |
| EP | 0 878 831 A2 | 11/1998 |
| FR | 2671304 A1 | 7/1992 |
| GB | 2291951 A | 2/1996 |
| GB | 2 325 782 A | 12/1998 |
| JP | 54063613 | 4/1980 |
| JP | 11-290789 | 10/1999 |
| JP | 2001-237210 | 8/2001 |
| JP | 2001-293439 | 10/2001 |
| TW | 476099 | 2/2002 |

OTHER PUBLICATIONS

Feb. 5, 2010 Response to Office Action of U.S. Appl. No. 12/239,724 Mailed Nov. 9, 2009.

Notice of Allowance of U.S. Appl. No. 12/245,762 Mailed Apr. 15, 2010.

International Search Report and Written Opinion of International Application No. PCT/US07/05737 dated Oct. 1, 2007.

International Preliminary Report on Patentability and Written Opinion of International Application No. PCT/US2007/005737 dated Sep. 18, 2008.

Final Office Action of U.S. Appl. No. 12/239,724 Mailed May 10, 2010.

Office Action of U.S. Appl. No. 12/239,724 Mailed Nov. 9, 2009.

Brown et al., U.S. Appl. No. 09/580,879 filed May 30, 2000.

Office Action of U.S. Appl. No. 09/580,879 Mailed Mar. 17, 2003.

Office Action of U.S. Appl. No. 11/048,099 Mailed Sep. 26, 2008.

Jan. 26, 2009 Response to Office Action of U.S. Appl. No. 11/048,099 Mailed Sep. 26, 2008.

Final Office Action of U.S. Appl. No. 11/048,099 Mailed Apr. 24, 2009.

Restriction Requirement of U.S. Appl. No. 11/048,099 mailed May 5, 2008.

Jun. 5, 2008 Response to Restriction Requirement of U.S. Appl. No. 11/048,099 mailed May 5, 2008.

Restriction Requirement of U.S. Appl. No. 12/239,724 mailed Jul. 10, 2009.

Sep. 10, 2009 Response to Restriction Requirement of U.S. Appl. No. 12/239,724 mailed Jul. 10, 2009.

Applicant Summary of Interview with Examiner filed in U.S. Appl. No. 12/239,724 on Nov. 20, 2009.

Restriction Requirement of U.S. Appl. No. 09/580,879 mailed Nov. 22, 2002.

Dec. 19, 2002 Response to Restriction Requirement of U.S. Appl. No. 09/580,879 mailed Nov. 22, 2002.

Restriction Requirement of U.S. Appl. No. 09/580,879 mailed Jan. 28, 2003.

Feb. 28, 2003 Response to Restriction Requirement of U.S. Appl. No. 09/580,879 mailed Jan. 27, 2003.

Notice of Abandonment of U.S. Appl. No. 12/239,724 mailed Dec. 6, 2010.

* cited by examiner

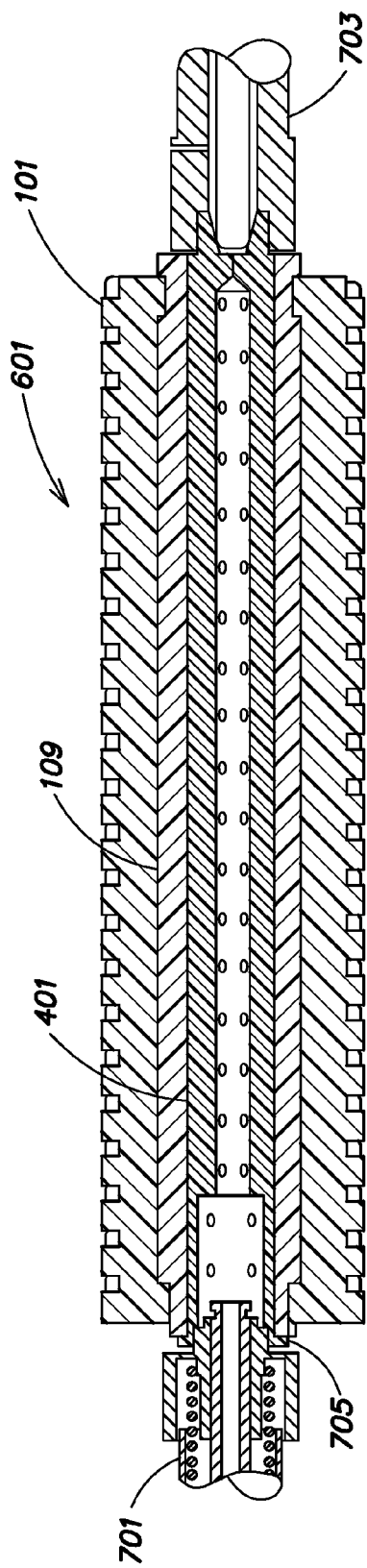
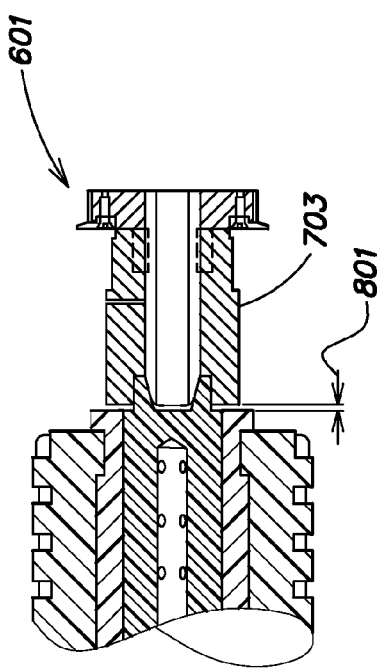
FIG. 7
FIG. 8

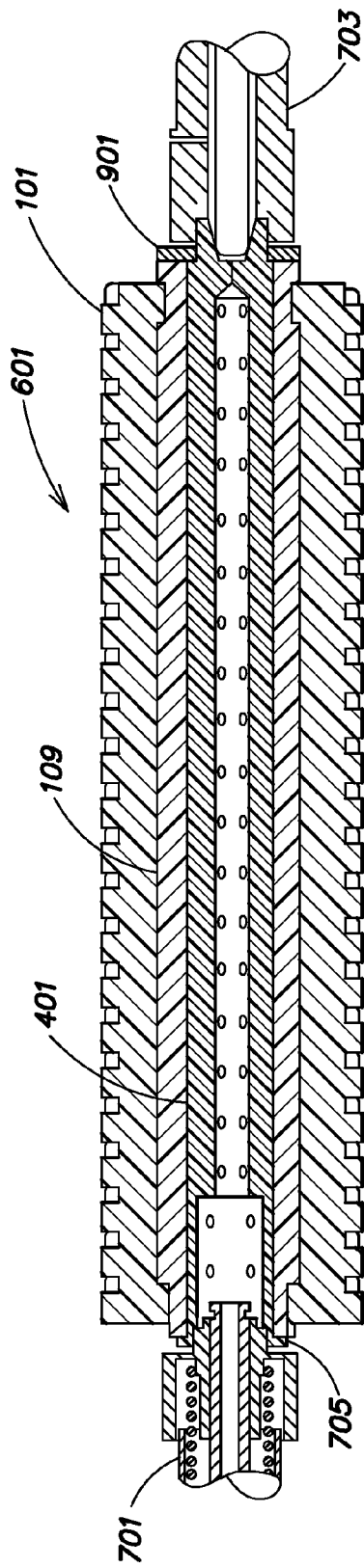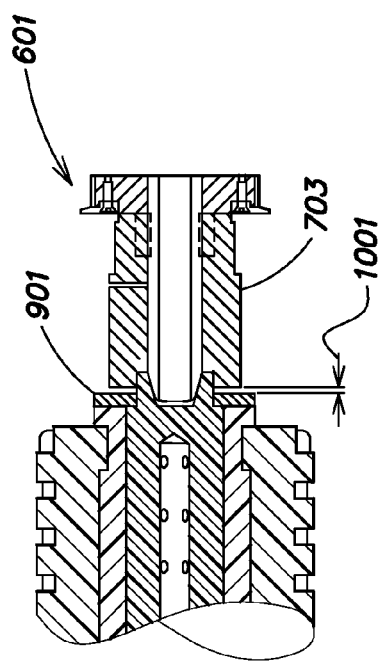

US 8,407,846 B2

SCRUBBER BRUSH WITH SLEEVE AND BRUSH MANDREL FOR USE WITH THE SCRUBBER BRUSH

The present application claims priority from U.S. Provisional Patent Application Ser. No. 60/780,688, filed Mar. 7, 2006, which is hereby incorporated by reference herein in its entirety.

FIELD OF THE INVENTION

The present invention relates generally to semiconductor device manufacturing, and more particularly to a scrubber brush with a sleeve, and a brush mandrel for use with the scrubber brush.

BACKGROUND

A scrubber brush assembly, which includes a scrubber brush coupled to a mandrel, may be used for cleaning a substrate. For example, the scrubber brush assembly may be employed in a substrate processing system, such as a substrate cleaning system, to scrub a major surface of a substrate during substrate processing. Further, the scrubber brush assembly may be used in other substrate processing systems.

To assemble a conventional scrubber brush assembly for use in a substrate processing system, the scrubber brush must be installed (e.g., slid) onto the mandrel. However, installing a scrubber brush on a mandrel is difficult due to friction created between the scrubber brush and the mandrel during assembly. Accordingly, improved methods and apparatus for installing a scrubber brush on a mandrel are desired.

SUMMARY OF THE INVENTION

In a first aspect of the invention, a method for assembling a scrubber brush assembly is provided. The method includes (1) providing a scrubber brush formed on a sleeve; and (2) inserting a mandrel into the sleeve to form the brush assembly.

In a second aspect of the invention, a scrubber brush assembly is provided. The scrubber brush assembly includes (1) a cylindrical brush including exterior and interior surfaces; and (2) a sleeve having an exterior surface coupled to the interior surface of the scrubber brush and an interior surface. The exterior surface of the sleeve includes first coupling features adapted to prevent rotation of the sleeve relative to the brush. The scrubber brush assembly also includes a mandrel coupled to the interior surface of the sleeve.

In a third aspect of the invention, a sleeve for use in a scrubber brush assembly is provided. The sleeve includes a cylindrical body having an exterior surface adapted to couple to a scrubber brush and an interior surface adapted to couple to a mandrel.

In a fourth aspect of the invention, a mandrel is provided for use in a scrubber brush assembly having a scrubber brush formed on a sleeve. The mandrel includes a cylindrical body having an exterior surface adapted to couple to an interior surface of the sleeve. Numerous other aspects are provided.

Other features and aspects of the present invention will become more fully apparent from the following detailed description of exemplary embodiments, the appended claims and the accompanying drawings.

BRIEF DESCRIPTION OF THE DRAWINGS

FIG. 7 is a side cross sectional view of a brush assembly inserted between an exemplary rotary mount and drive shaft of a substrate processing system as provided in accordance with the present invention.

FIG. 8 is an enlarged side cross sectional view of a portion of the brush assembly depicted in FIG. 7 illustrating a spacing between the sleeve and the drive shaft.

FIG. 9 is a side cross sectional view of a brush assembly inserted between a rotary mount and drive shaft of a substrate processing system including a spacer as provided in accordance with the present invention.

FIG. 10 is an enlarged side cross sectional view of a portion of the brush assembly depicted in FIG. 9 illustrating a spacing between the sleeve and the drive shaft.

DETAILED DESCRIPTION

A scrubber brush is provided that includes a sleeve adapted to couple to a brush mandrel. In at least one embodiment, the scrubber brush is formed on the sleeve when the scrubber brush is manufactured. A brush mandrel is provided that fits within the sleeve so as to form a scrubber brush assembly that may be used for cleaning a substrate. For example, the scrubber brush assembly may be employed in a substrate processing system, such as a substrate cleaning system, to scrub a major surface of a substrate during substrate processing. Further, the scrubber brush assembly may be used in other substrate processing systems.

To assemble the scrubber brush assembly, the scrubber brush must be installed (e.g., slid) onto the mandrel. As stated, installing a conventional scrubber brush on a mandrel is difficult due to friction created between the scrubber brush and the mandrel during assembly. The present methods and apparatus reduce friction created between the scrubber brush and mandrel while assembling the brush assembly by providing the scrubber brush with a sleeve. For example, in some embodiments, the sleeve may slide easily over the mandrel and/or lock the scrubber brush in place relative to the mandrel (e.g., so as to prevent the scrubber brush from sliding and/or twisting relative to the mandrel). These and other aspects of the invention are described below with reference to FIGS. 1-10.

Figure 1:
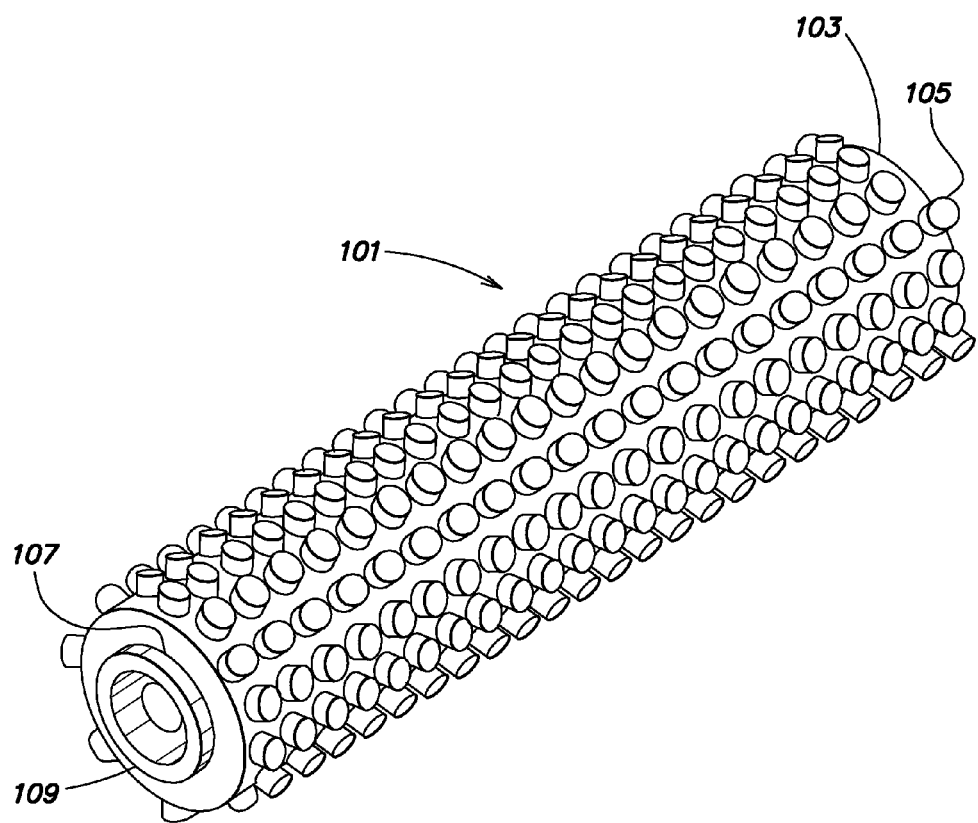
FIG. 1 is an isometric view of a scrubber brush that may be included in a scrubber brush assembly provided in accordance with an embodiment of the present invention.

FIG. 1 is an isometric view of a scrubber brush 101 that may be included in a brush assembly in accordance with an embodiment of the present invention. The brush 101 may be cylindrical in shape and have a profiled exterior surface 103. For example, the exterior surface 103 of the brush 101 may include raised surface features 105, such as nodules. Alternatively, in other embodiments, the exterior surface 103 of the brush 101 may include a smooth geometry. The brush 101 may, for example, be porous and/or sponge like and/or may comprise a resilient material such as polyvinyl acetate (PVA). The brush 101 may comprise other and/or different materials and/or shapes, and may exhibit other and/or different material characteristics.

The brush 101 may include an interior surface 107 that is coupled to a sleeve 109. As will be described below, the sleeve 109 may be used to easily couple the brush 101 to a brush mandrel so as to form a brush assembly (for use during substrate processing). In one or more embodiments of the invention, the brush 101 may be formed directly on the sleeve 109. For example, the sleeve 109 may be molded to the brush 101 during formation of the brush (e.g., by placed the sleeve within a brush mold prior to introducing brush material to the mold). Alternatively, the brush 101 may be formed and then coupled to the sleeve 109 (e.g., via bonding, gluing or another suitable method).

The sleeve 109 preferably is formed from a material that is resistant to any chemistry used during substrate scrubbing. For example, the sleeve 109 may be formed from polyvinylidenefluoride (PVDF) or another suitable material.

Figure 2:
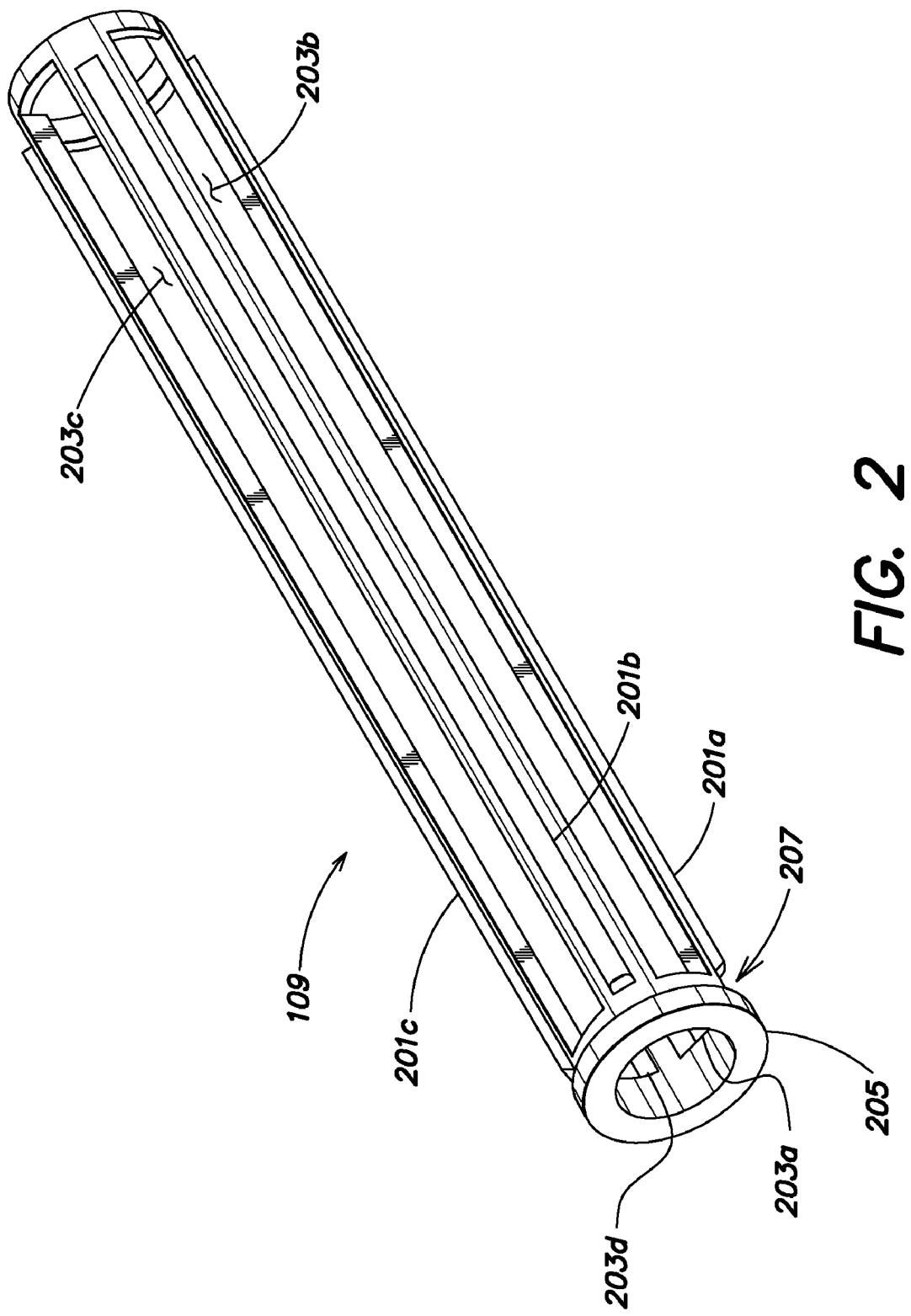
FIG. 2 is an isometric view of an exemplary sleeve provided in accordance with the present invention.
Figure 3A:
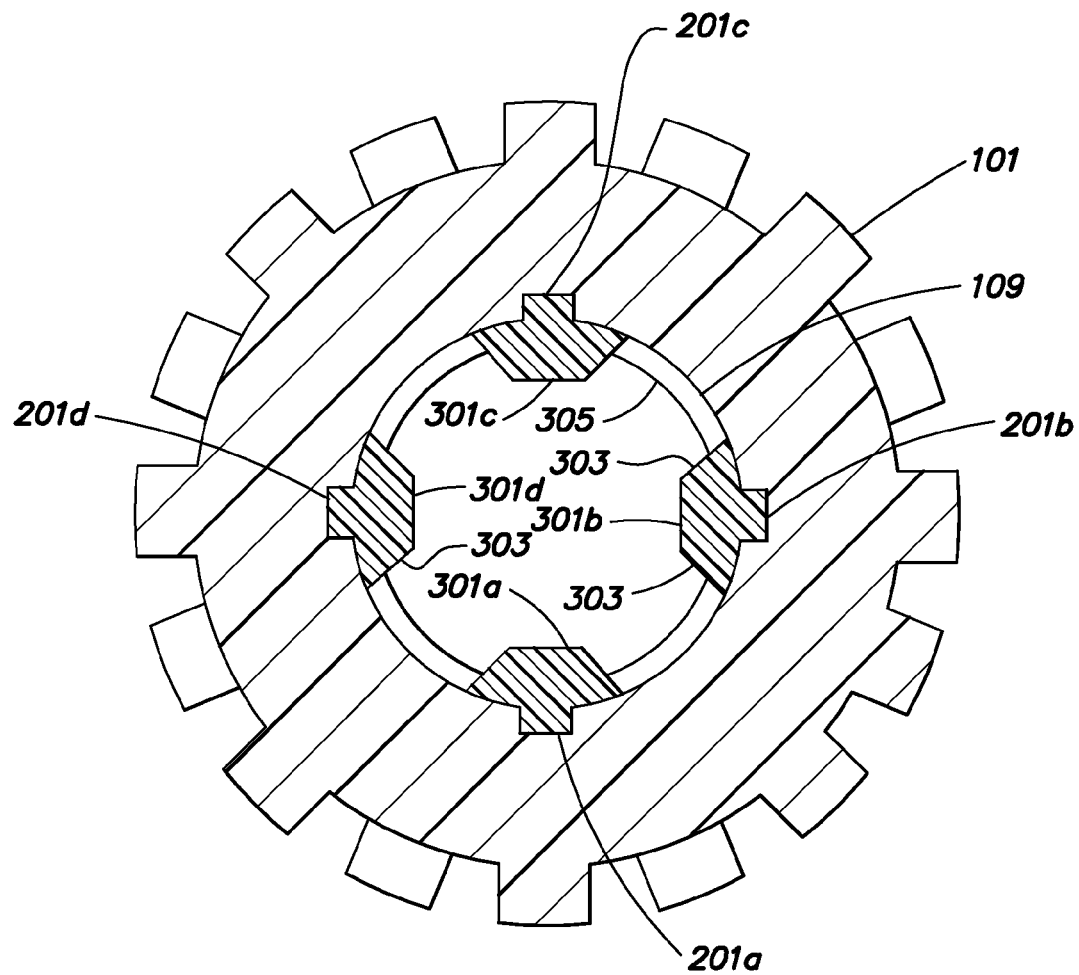
FIG. 3A is an end view of an exemplary embodiment of a sleeve coupled to a brush provided in accordance with the present invention.
Figure 3B:
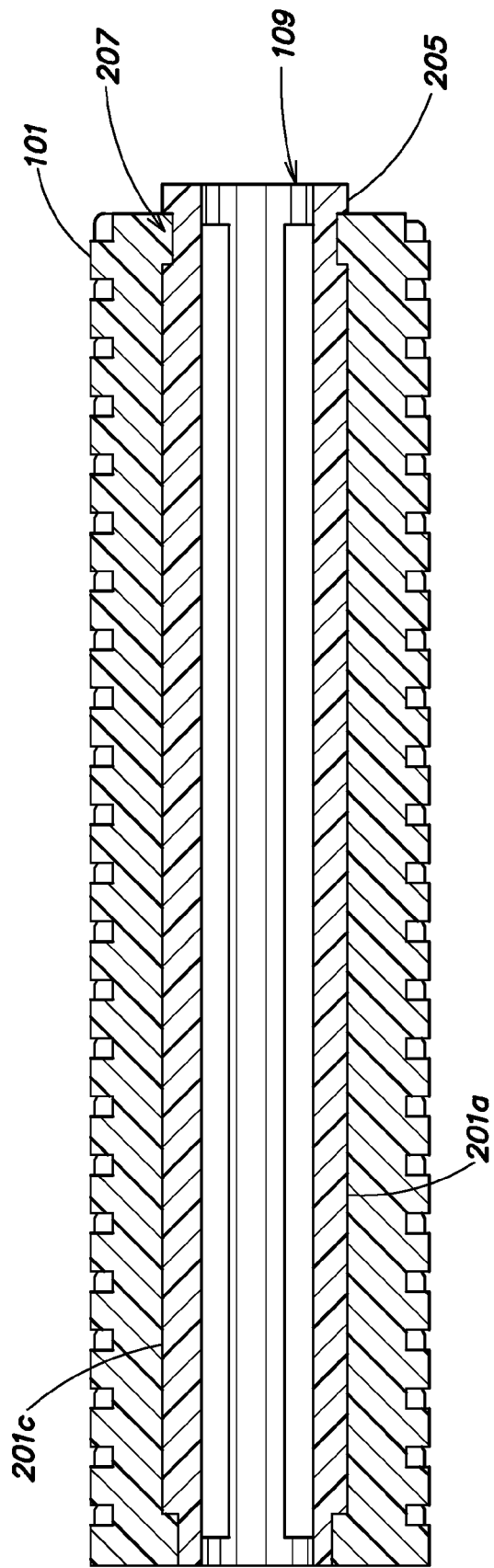
FIG. 3B is a side cross sectional view of an exemplary embodiment of a sleeve coupled to a brush provided in accordance with the present invention.

FIG. 2 is an isometric view of an exemplary embodiment of the sleeve 109 of FIG. 1 provided in accordance with the present invention; and FIGS. 3A and 3B are an end view and a side cross sectional view, respectively, of the sleeve 109 having the brush 101 formed on the sleeve 109. As shown in FIGS. 2-3B, the sleeve 109 sets the inner diameter of the brush 101.

In the embodiment of FIGS. 2-3B, the sleeve 109 includes four outside ribs 201a-d that extend the length of the sleeve 109 and that prevent the sleeve 109 from twisting and/or rotating relative to the brush 101. Additionally, as shown in FIG. 3A, the sleeve 109 includes four inside ribs 301a-d that extend the length of the sleeve 109 and that prevent the sleeve 109 from twisting and/or rotating relative to a brush mandrel inserted in the sleeve 109 (as described further below with reference to FIGS. 4-6). In at least one embodiment, the inside ribs 301a-d are provided with sloped sidewalls 303 that extend inward from an inner surface 305 of the sleeve 109 (e.g., when the openings in the sleeve 109 are formed by a piercing process). Other numbers and/or types of outside and/or inside ribs may be employed. For example, the ribs may not extend the entire length of the sleeve 109, or each rib may be replaced with two or more ribs that run along a length of the sleeve 109.

The sleeve 109 also includes a plurality of openings 203a-d into which the brush 101 may extend. The openings 203a-d also limit twisting and/or rotating of the sleeve 109 relative to the brush 101 and allow chemicals to be jetted into the brush 101 from a mandrel inserted in the sleeve 109 as described below. Other numbers and/or shapes of openings 203a-d may be employed. For example, each opening 203a-d may be replaced by two or more openings that run along a length of the sleeve 109.

At least one end of the sleeve 109 may include a lip 205 that creates a gap or recess 207 between the lip 205 and the outer ribs 201a-d (see FIGS. 2 and 3B). As is shown in FIG. 3B, a portion of the brush 101 may extend into the recess 207 so that the brush 101 is prevented from sliding (longitudinally) off of the sleeve 109. Note that one or both ends of the sleeve 109 may include a lip 205.

Figure 4:
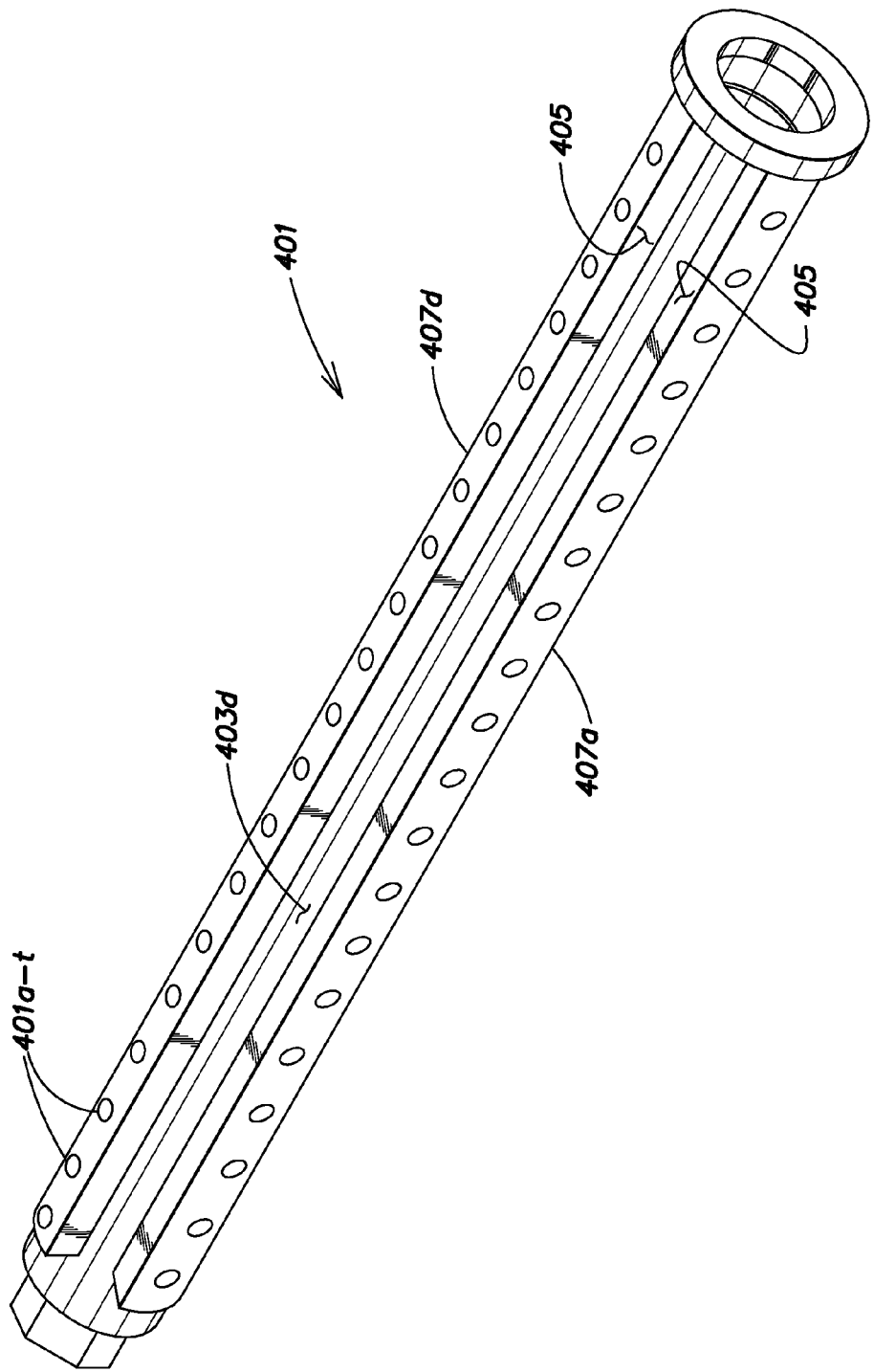
FIG. 4 is an isometric view of an exemplary mandrel provided in accordance with the present invention.

FIG. 4 is an isometric view of an exemplary mandrel 401 provided in accordance with the present invention. With reference to FIG. 4, the mandrel 401 includes a plurality of grooves 403a-d (only 403d shown in FIG. 4) sized to couple and/or mate with respective inside ribs 301a-d of the sleeve 109. That is, the mandrel 401 is shaped so that inside ribs 301a-d (FIG. 3A) of the sleeve 109 slide within the grooves 403a-d to allow the mandrel 401 to be inserted into the sleeve 109 during formation of a brush assembly as described further below.

As shown in FIG. 4, the grooves 403a-d have sloped sidewalls 405 that approximately match a slope of the sidewalls 303 of inside ribs 301a-d. Other sidewall shapes may be employed for the grooves 403a-d and/or inside ribs 301a-d. In at least one embodiment, the sidewalls 405, 303 are angled at about 45 degrees from the inner edges of the inside ribs 301a-d, although other angles may be used.

The mandrel 401 also includes raised regions 407a-d (only 407a and 407d shown in FIG. 4) between the grooves 403a-d. The raised regions 407a-d are sized so as to extend between the inner ribs 301a-d of the sleeve 109 and to contact the inner surface 305 of the sleeve 109. In at least one embodiment, each raised region 407a-d may include a plurality of openings 401a-t for allowing jetting of chemicals from the mandrel 401 into the brush 101. While a line of 20 holes is shown in FIG. 4 for each raised region 407a-d, it will be understood that other numbers, layouts, sizes and/or shapes of openings may be used.

The mandrel 401 preferably is formed from a material that is resistant to any chemistry used during substrate scrubbing. For example, the mandrel 401 may be formed from polyvinylidenefluoride (PVDF) or another suitable material.

Figure 5:
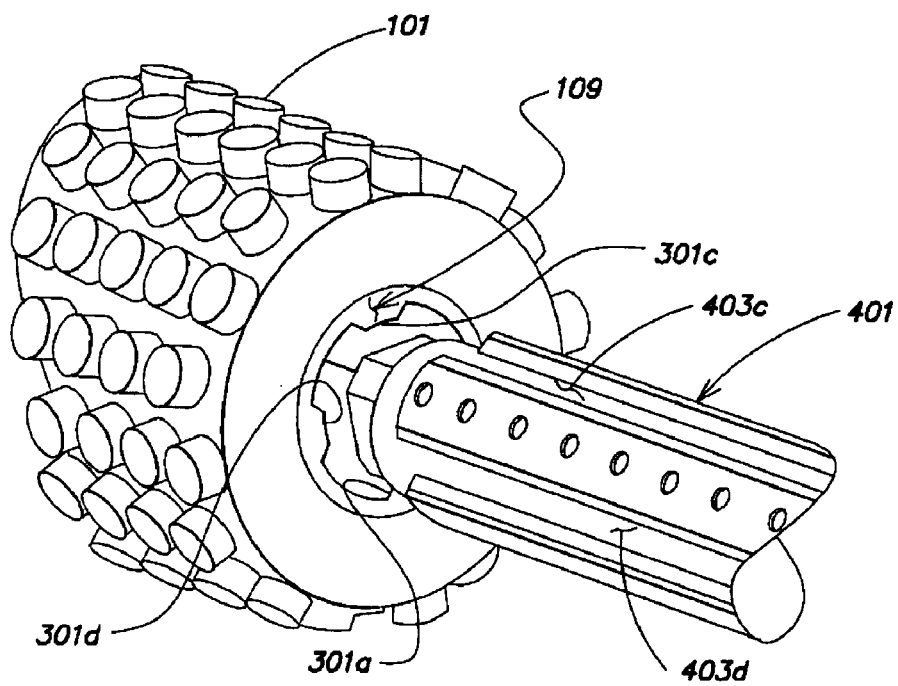
FIG. 5 is an enlarged, isometric view of the mandrel depicted in FIG. 4 being inserted into to a brush and sleeve as provided in accordance with the present invention.

FIG. 5 is an enlarged, isometric view of the mandrel 401 being inserted into to the brush 101 and sleeve 109. As shown in FIG. 5, the inner ribs 301a-d of the sleeve 109 are sized so as to fit within the grooves 403a-d of the mandrel 401 and to allow the mandrel 401 to slide into the sleeve 109.

Figure 6:
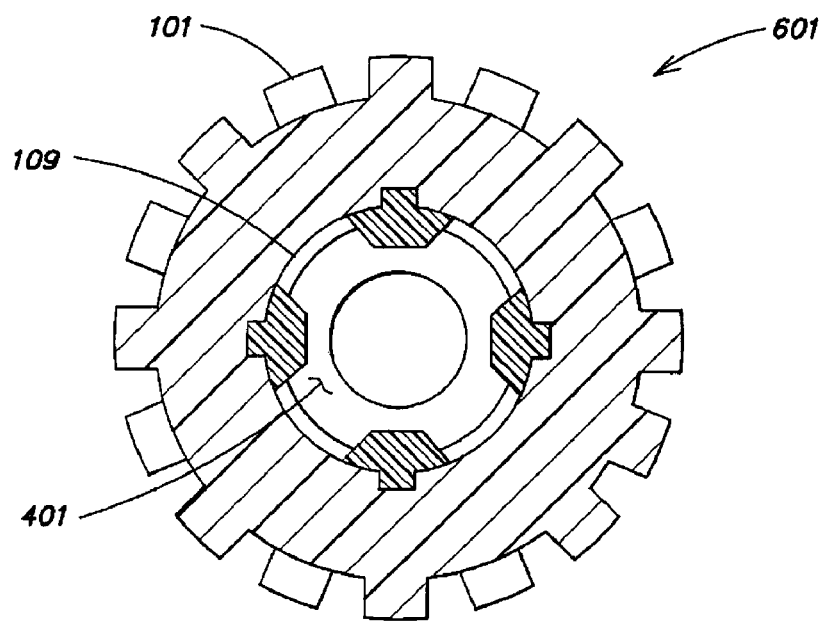
FIG. 6 is an end view of an exemplary brush assembly formed by inserting a mandrel into a sleeve as provided in accordance with the present invention.

FIG. 6 is an end view of a brush assembly 601 formed by inserting the mandrel 401 into the sleeve 109 (and brush 101). The mandrel 401 and the sleeve 109 preferably are designed so that the mandrel 401 may be easily inserted into the sleeve 109 to form the brush assembly 601. Thereafter the brush assembly 601 may be used for substrate processing, such as to scrub a major surface of a substrate. Because of the inner ribs 301a-d of the sleeve 109 and the grooves 403a-d of the mandrel 401, the mandrel 401 and the sleeve 109 (and the brush 101) are prevented from slipping and/or rotating relative to one another. That is, the mandrel 401 may be driven/rotated, such as by the motor of a brush box or other tool, to cause the brush 101 to rotate relative to a substrate surface during a scrubbing operation.

When the brush 101 needs to be replaced, the mandrel 401 may be easily removed from the sleeve 109 and inserted into a new sleeve 109 having a brush 101 formed thereon so as to form a new brush assembly. The new brush assembly then may be used for substrate processing as previously described.

FIG. 7 is a side cross sectional view of the brush assembly 601 inserted between a rotary mount 701 and drive shaft 703 of a substrate processing system (not separately shown), such as a brush box. As shown in FIG. 7, to prevent the mandrel 401 from sliding along the sleeve 109, one end of the mandrel 401 may include a stop or lip 705 that contacts the sleeve 109 when the mandrel 401 is fully inserted into the sleeve 109. The opposite end of the mandrel 401 contacts the drive shaft 703. In at least one embodiment of the invention, the mandrel 401 is configured so as to contact the drive shaft 703 while creating a space between the sleeve 109 and the drive shaft 703. FIG. 8 is an enlarged side cross sectional view of a portion of the brush assembly 601 of FIG. 7 illustrating a spacing 801 between the sleeve 109 and the drive shaft 703. The spacing 801 may be used, for example, to accommodate tolerancing and/or process errors.

If the spacing between the drive shaft 703 and sleeve 109 is too large (e.g., so as to allow too much sliding of the sleeve 109 along the mandrel 401), a spacer may be provided between the sleeve 109 and drive shaft 703. For example, FIG. 9 is a side cross sectional view of the brush assembly 601 inserted between the rotary mount 701 and drive shaft 703 of a substrate processing system (not separately shown). As shown in FIG. 9, to prevent the mandrel 401 from sliding along the sleeve 109, one end of the mandrel 401 includes the lip 705 that contacts the sleeve 109 when the mandrel 401 is fully inserted into the sleeve 109.

The opposite end of the mandrel 401 contacts the drive shaft 703, and a spacer 901 is provided between the drive shaft 703 and sleeve 109. The spacer 901 may be formed from any suitable material, such as PVDF or the like and have any suitable thickness. In at least one embodiment of the invention, the mandrel 401 is configured so as to contact the drive shaft 703 while creating a space between the spacer 901 and the drive shaft 703. FIG. 10 is an enlarged side cross sectional view of a portion of the brush assembly 601 of FIG. 9 illustrating a spacing 1001 between the spacer 901 and the drive shaft 703.

Accordingly, while the present invention has been disclosed in connection with exemplary embodiments thereof, it should be understood that other embodiments may fall within the spirit and scope of the invention, as defined by the following claims.

The invention claimed is:

1. A method for assembling a scrubber brush assembly, comprising:
   providing a scrubber brush formed on a sleeve;
   inserting a mandrel into the sleeve to form the scrubber brush assembly;
   providing aligned openings on the sleeve and mandrel such that a fluid may be jetted through the openings in the mandrel to the scrubber brush; and
   extending the scrubber brush through the openings on the sleeve.

2. The method of claim 1, further comprising:
   providing coupling features on an exterior surface of the sleeve adapted to prevent rotation of the sleeve relative to the scrubber brush.

3. The method of claim 1, further comprising:
   providing mating coupling features on the sleeve and the mandrel adapted to prevent rotation of the mandrel relative to the sleeve.

4. A scrubber brush assembly comprising:
   a cylindrical brush including exterior and interior surfaces;
   a sleeve having an exterior surface coupled to the interior surface of the brush and an interior surface, the exterior surface of the sleeve including first coupling features adapted to prevent rotation of the sleeve relative to the brush, the sleeve further including a plurality of openings into which the brush extends; and
   a mandrel coupled to the interior surface of the sleeve;
   wherein the mandrel includes a plurality of openings aligned with the plurality of openings of the sleeve so as to enable delivery of fluid from the plurality of openings in the mandrel to the brush.

5. The scrubber brush assembly of claim 4, wherein the first coupling features comprise a plurality of ribs that protrude from the exterior surface of the sleeve and extend longitudinally along a length of the sleeve.

6. The scrubber brush assembly of claim 5, wherein the plurality of ribs includes four ribs equally spaced apart on the exterior surface of the sleeve.

7. The scrubber brush assembly of claim 4, wherein the interior surface of the sleeve includes second coupling features adapted to prevent rotation of the sleeve relative to the mandrel.

8. The scrubber brush assembly of claim 7, wherein the second coupling features comprise a plurality of ribs that protrude from the interior surface of the sleeve and extend longitudinally along a length of the sleeve.

9. A sleeve for use in a scrubber brush assembly comprising:
   a cylindrical body having an exterior surface adapted to couple to a scrubber brush and an interior surface adapted to couple to a mandrel;
   first coupling features positioned on the exterior surface adapted to prevent rotation of the sleeve relative to the scrubber brush;
   and a plurality of openings into which the brush extends;
   wherein the plurality of openings are adapted to align with a plurality of openings in a mandrel so as to enable delivery of fluid from the plurality of openings in the mandrel to the brush.

10. The sleeve of claim 9, wherein the first coupling features comprise a plurality of ribs that protrude from the exterior surface of the sleeve and extend longitudinally along a length of the sleeve.

11. The sleeve of claim 10, wherein the plurality of ribs includes four ribs equally spaced apart on the exterior surface of the sleeve.

12. The sleeve of claim 9, further comprising:
   second coupling features positioned on the interior surface adapted to prevent rotation of the sleeve relative to the mandrel.

13. The sleeve of claim 12, wherein the second coupling features comprise a plurality of ribs that protrude from the interior surface of the sleeve and extend longitudinally along a length of the sleeve.

14. The sleeve of claim 13, wherein the plurality of ribs include sloping sidewalls extending inward from the interior surface of the sleeve.

15. A mandrel for use in a scrubber brush assembly having a scrubber brush formed on a sleeve comprising:
   a cylindrical body having first and second ends and an exterior surface adapted to couple to an interior surface of the sleeve;
   a drive-shaft coupling feature positioned at the first end of the cylindrical body adapted to couple the mandrel to a drive shaft and to provide a space between the drive shaft and the sleeve;
   a plurality of openings adapted to align with a plurality of openings of the sleeve so as to enable delivery of fluid from the plurality of openings in the mandrel to the scrubber brush; and
   a plurality of grooves and raised regions positioned on the exterior surface of the cylindrical body.

16. The mandrel of claim 15, wherein the grooves are adapted to mate with corresponding coupling features on the interior surface of the sleeve.

17. The mandrel of claim 15, wherein the second end of the cylindrical body has a lip adapted to prevent the mandrel from sliding off of the interior surface of the sleeve in a longitudinal direction.

* * * * *